(12) United States Patent
Mathew et al.

(10) Patent No.: US 6,498,636 B1
(45) Date of Patent: Dec. 24, 2002

(54) APPARATUS AND METHOD FOR SUBSTANTIALLY STRESS-FREE ELECTRICAL CONNECTION TO A LIQUID CRYSTAL DISPLAY

(75) Inventors: Ranjan J. Mathew, San Jose, CA (US); G. Cade Murray, Fremont, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/281,758

(22) Filed: Mar. 30, 1999

(51) Int. Cl.[7] .................................................. G02F 1/13
(52) U.S. Cl. ..................... 349/187; 349/149; 349/150; 349/151; 349/152
(58) Field of Search ................................ 349/150, 149, 349/151, 152, 187

(56) References Cited

U.S. PATENT DOCUMENTS

| | | | | |
|---|---|---|---|---|
| 5,288,950 A | * | 2/1994 | Ushio et al. ................ 174/254 |
| 5,328,079 A | * | 7/1994 | Mathew et al. .......... 228/180.5 |
| 5,362,547 A | * | 11/1994 | Yamazaki .................. 428/167 |
| 5,398,128 A | * | 3/1995 | Tajima et al. ................ 359/82 |
| 5,468,994 A | * | 11/1995 | Pendse ........................ 257/693 |
| 5,502,289 A | * | 3/1996 | Takiar et al. ................ 174/266 |
| 5,613,861 A | * | 3/1997 | Smith et al. .................. 439/81 |
| 6,059,624 A | * | 5/2000 | Dehaine et al. ................ 445/24 |
| 6,069,679 A | * | 5/2000 | Joslin et al. ................ 349/149 |
| 6,104,464 A | * | 8/2000 | Adachi et al. .............. 349/150 |

* cited by examiner

Primary Examiner—Kenneth Parker
Assistant Examiner—David Chung
(74) Attorney, Agent, or Firm—Beyer Weaver & Thomas LLP

(57) ABSTRACT

A connection assembly (50) to electrically couple a transparent plate (24) of a liquid crystal display device (51) to an operating subsystem. The connection assembly (50) includes an elongated flexible tape member (52) having an elongated metallic circuit (53) which further includes a main circuit portion (55) fixedly mounted to the tape member (52), and a lead terminal (56). This terminal (56) includes a contact portion (57) adapted to electrically couple to the transparent plate (24), and a substantially flexible and movable conductive joint portion (58). The contact portion (57) and the conductive joint portion (58) electrically couple the transparent plate (24) to the circuit portion (55) of the metallic circuit (53) in a manner substantially minimizing residual stresses formed from the electrical coupling between the transparent plate (24) and the circuit portion (55).

38 Claims, 6 Drawing Sheets

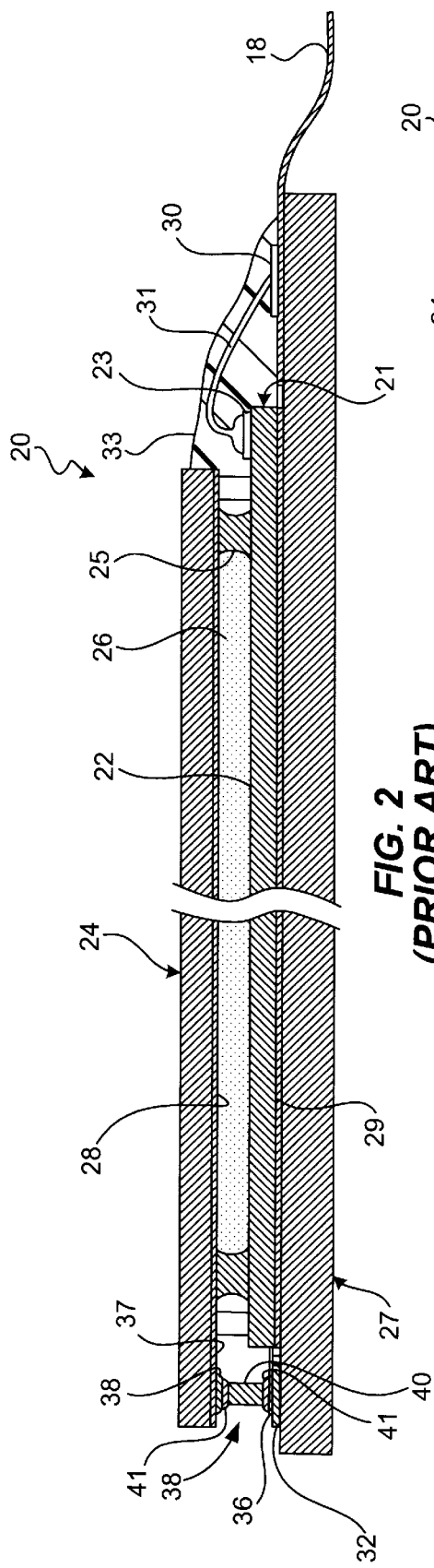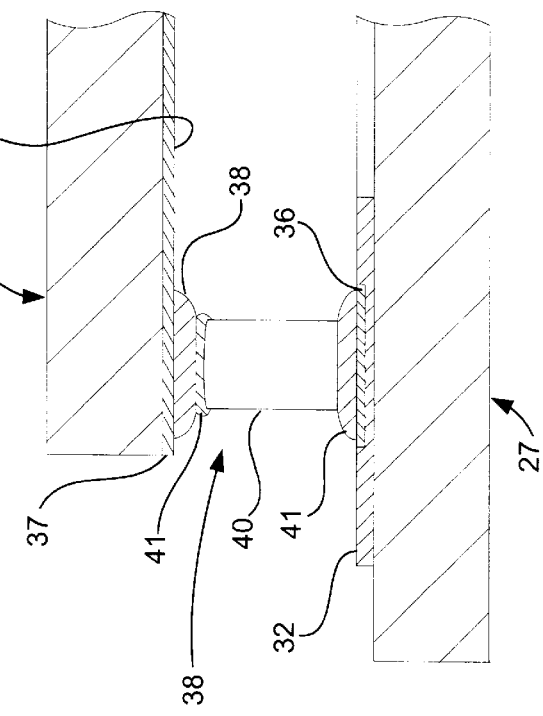
FIG. 2 (PRIOR ART)
FIG. 3 (PRIOR ART)

APPARATUS AND METHOD FOR SUBSTANTIALLY STRESS-FREE ELECTRICAL CONNECTION TO A LIQUID CRYSTAL DISPLAY

TECHNICAL FIELD

The present invention relates, generally, to liquid crystal display assemblies and, more particularly, relates to miniature liquid crystal display assemblies constructed to reduce residual stresses.

BACKGROUND ART

In the recent past, substantial research and development resources have been directed toward small scale Liquid Crystal Display (LCD) and light valve technologies. These high information content, miniature LCD assemblies enable enhanced availability of graphics, data and video information for employment in high resolution projection displays, such as a reflective LCD projectors, SXGA formats (1,280× 1,024 pixel resolution) and even HDTV formats (above 1,000 line resolution), or the like.

Reflective LCD projectors, in particular, are highly desirable since they offer the brightness of traditional three-lamp front-projection systems in combination with the high resolution of an LCD panel. At the heart of these optical engines is reflective liquid crystal on crystalline silicon light valve technology which, when combined with sophisticated optical architecture and the appropriate electronic interface, enables very high resolution, high brightness, large screen displays.

One problem associated with both transmissive and reflective-type LCD panels assemblies is bowing or warpage of individual panels caused by residual stresses acting upon the components during operation. This is particularly noticeable in reflective-type LCD panels which have increased flatness requirements due to the nature of the reflective surface of the die. For example, thermal expansion characteristics, as well as lattice mismatching, can generate significant stresses in the underlying substrate material (the silicon), therein causing significant bowing of the mirrored surface. The bowing, which translates to a non-planarity of the surface, causes both (1) a non-uniform thickness of the liquid crystal layer between the bowed reflective surface and the planar transmissive top layer, and (2) variations in the path length of the reflected light from different parts of the element, and of the array. These effects compromise the electro-optic properties of the elements and/or array.

Typically, a primary source of these residual stresses originate from the different materials and composites of the LCD panel having different coefficients of expansion. This is best shown in FIGS. 1 and 2 which illustrate a flex circuit device 18 electrically coupling a conventional small scale LCD assembly 20 to an electronic interface (not shown). The LCD assembly 20 includes a die 21 having a pixel array 22 which is generally composed of rows and columns of electrically conductive pathways each forming an individual pixel (not shown). Each pixel can be individually changed to an "on" condition by selecting the appropriate row and column of pixel array 22. Positioned around or concentrated on one end of the pixel array are a plurality of die bond pads 23 which are internally connected to the pixel array 22 to enable operational control thereof. Selection of the appropriate pixel is controlled by control circuitry, either included within the die 21 or external to the die 21. In either configuration, external control signals may be used to control the functions of the die 21.

A transparent glass plate 24 is typically placed over the die 21 and the pixel array 22, such that a portion of the glass plate 24 overhangs the die 21. The glass plate 24 is usually affixed to die 21 through an adhesive seal 25 which together cooperate to define a sealed volume encompassing the pixel array 22. This sealed volume is then commonly filled with a solution 26 of Polymer Dispersed Liquid Crystals (PDLC). To facilitate grounding or the application of a charge across the face of the glass plate 24, a conductive coating 37 may be deposited over the undersurface 28 thereof.

The die 21 is typically rigidly or semi-rigidly mounted to a substrate 27 for mounting support and heat conductive dissipation for the die. A conductive adhesive 29 (FIG. 2), such as a conductive epoxy or a thermally conductive non-adhesive grease, is generally applied to the undersurface of the die 21 to affix the die directly to the top surface of the substrate 27. Accordingly, a heat conductive pathway is created directly between the die and the substrate to dissipate heat generated by the die.

The flex circuit 18 includes a plurality of flex circuit bond pads 30 which are typically wire bonded to the die bond pads 23 through bonding wires 31. More recently, a distal ringed coupling portion 32 of flex circuit 18 is adhesively or fixedly mounted to the top surface of substrate 27 for support thereof. Finally, a glob coating 33 is applied to die 21, substrate 27 and the distal end of flex circuit 18. The glob coating 33 (FIG. 3) further normally encapsulates the bonding wires 31 and the die and flex circuit bonding pads 23 and 30 without obscuring a view of the pixel array 22 through the glass plate 24.

As previously indicated, one important aspect in the proper operation of these small scale LCD or light valve assemblies is the maintenance of proper distance uniformity (preferably about 2–4$\mu$m) between the pixel array and the undersurface 28 of the glass plate. Variances in the separation of the glass plates may often times cause the pixel array to function improperly or cause operational failure.

Conventional rigid display device constructions, for example, often warp during operation since the substrate 27, the glass plate 24 and the silicon die 21 are all composed of materials or composites having different coefficients of expansion. The individual components of the LCD assembly, therefore, often expand at different degrees and rates. Further, depending in part upon the construction processes, such as the adhesive curing techniques, significant residual stresses may be induced upon the cell. Eventually, in severe instances, the glass plate 24 may delaminate from the die 21. At a minimum, these internal stresses cause optical defects such as variations in color uniformity and fringes, and variations in the cell gap thickness may cause optical shadows.

One particular cause of residual stresses is the formation of an electrical connection between the transparent glass plate 24 and a circuit 36 of the flex circuit 18 which may be employed for applying a charge or the like of the glass plate. A conductive coating 37 of indium tin oxide is typically deposited over the undersurface 28 of the glass plate 24 to facilitate electrical connection therewith. As best viewed in FIG. 3, an indium solder bump or tab 38 is pre-bonded to the indium coating 37 to enhance electrical coupling therewith. A conductive kovar slug 40 is positioned between the solder tab 38 and the circuit 36 which in turn is bonded therebetween using a conductive epoxy 41 or the like.

While this approach sufficiently electrically couples the transparent glass 24 to the flex circuit 18, the electrical connection is substantially rigid in nature. Hence, the epoxies 41, the kovar slug 40 and/or the indium solder tab 38 expand or contract during operation thereof, residual stresses are imparted upon the transparent glass plate by the rigid connection to the circuit 36, which in turn is fixedly mounted to the rigid substrate 27. For example, upon curing of the epoxy 41, shrinkage occurs which imparts a residual stress upon the glass 24.

Accordingly, there is a need to provide a LCD assembly which minimizes residual stress induced upon the cell.

DISCLOSURE OF INVENTION

The present invention provides a connection assembly adapted to electrically couple a transparent plate of a liquid crystal display device to an operating subsystem. The connection assembly includes an elongated flexible tape member having an elongated metallic circuit. This metallic circuit includes a main circuit portion fixedly mounted to the tape member, and a lead terminal. This terminal includes a contact portion adapted to electrically couple to the transparent plate, and a substantially flexible and movable conductive joint portion. Collectively, the contact portion and the conductive joint portion electrically couple the contact portion to the circuit portion of the metallic circuit in a manner substantially minimizing residual stresses formed from the electrical coupling between the transparent plate and the circuit portion.

In one embodiment, the conductive joint is provided by a section of the main circuit portion which is physically separated from fixed mounting to the tape member. Hence, the conductive joint is essentially part of the metallic main circuit portion separated from the polyamide tape member which enables substantial movement freedom by the conductive joint for a substantially stress-free electrical connection.

In another configuration, a liquid crystal display assembly is provided including a die having a pixel array and a plurality of bond pads in electrical communication with the pixel array. The display assembly further includes a transparent plate, and an adhesive seal adhesively coupling the die to the transparent plate. The adhesive seal, the transparent plate and the die cooperate to define a sealed volume therebetween encompassing the pixel array upon which a liquid crystal material is disposed within. A flex circuit device includes a flexible tape member, a plurality of primary circuits and a second circuit. The primary circuits terminate at respective first terminals of a coupling region thereof which are electrically coupled to the bond pads of the die. The second circuit includes a main circuit portion fixedly mounted to the tape member and terminates at a second terminal. The second terminal includes a contact portion adapted to electrically couple to the transparent plate and a substantially flexible and movable conductive joint portion electrically coupling the contact portion to the circuit portion of the second circuit in a manner substantially minimizing residual stresses formed from the electrical coupling between the transparent plate and the circuit portion.

In one embodiment of the liquid crystal display assembly, a substrate is provided which is coupled to a backside surface of the die. Moreover, the coupling region of the tape member, which preferably defines a receptacle portion formed and dimensioned for receipt of the liquid crystal display device therein, is fixedly mounted to the substrate.

In this arrangement, the conductive joint may be provided by a section of the main circuit portion which is physically separated from fixed mounting to the tape member and the substrate. This freedom of movement of the conductive joint enable a substantially stress-free electrical connection with the transparent plate.

In yet another embodiment, the substrate includes an aperture formed and dimensioned for receipt of a probe therethrough. During connection of the conductive joint to the transparent plate, a probe may be positioned through the aperture to contact a backside of the conductive joint an urge the same into heated contact against the transparent plate at a bond site for bonding thereof. Preferably, the probe is provided by a heated thermode, and the contact portion of the thermal bond conductive material forms a thermal bond between the transparent plate and the second terminal when contacted by the heated thermode.

In still another embodiment of the present invention, a method of packaging a liquid crystal display assembly is provided including providing a display device including a die having a pixel array, a transparent plate, an adhesive seal adhesively coupling the die to the transparent plate, and a liquid crystal material disposed within a sealed volume formed between the adhesive seal, the transparent plate and the die. The method further includes providing an elongated flexible tape member having a main circuit portion fixedly mounted thereto, and having a lead terminal thereof. The method of the present invention further includes electrically connecting a contact portion of the lead terminal to the transparent plate through a substantially flexible and movable conductive joint portion of the lead terminal to substantially minimize residual stresses formed from the electrical coupling between the transparent plate and the circuit portion.

Another embodiment of the method of the present invention includes forming the conductive joint by physically separating a section of the main circuit portion from fixed mounting to the tape member to enable the substantial flexibility thereof for a substantially stress-free electrical connection. The method further includes thermal bonding, or adhering through an electrically conductive pressure sensitive adhesive, the contact portion to transparent plate.

In another aspect of the present invention, a method of packaging a liquid crystal display assembly is included comprising: providing a display device including a die having a pixel array, a transparent plate, an adhesive seal adhesively coupling the die to the transparent plate, and a liquid crystal material disposed within a sealed volume formed between the adhesive seal, the transparent plate and the die. The method of the present invention further includes providing an elongated flexible tape member including a main circuit portion fixedly mounted thereto, and separating a section of the main circuit portion from fixed mounting to the tape member to form a lead terminal having a contact portion and a substantially flexible and movable conductive joint portion therebetween. The inventive method further includes electrically connecting the contact portion of the lead terminal to the transparent plate such that the substantially flexible and movable conductive joint portion substantially minimizes residual stresses formed from the electrical coupling between the transparent plate and the circuit portion.

In this arrangement, the method further includes mounting the die of the liquid crystal display device to a substrate, and affixing a distal coupling region of the tape member to the substrate. The electrically connecting may further include thermally bonding the contact portion to transparent plate.

BRIEF DESCRIPTION OF THE DRAWING

The assembly of the present invention has other objects and features of advantage which will be more readily apparent from the following description of the best mode of carrying out the invention and the appended claims, when taken in conjunction with the accompanying drawing, in which

FIG. 2 is an enlarged, fragmentary, side elevation view, in cross-section, of the prior art LCD assembly taken substantially along the plane of the line 2—2 in FIG. 1.

FIG. 3 is an enlarged, fragmentary, side elevation view, in cross-section, of the prior art the LCD assembly of FIG. 2 illustrating the electrical coupling of the transparent plate to a circuit of the flex circuit.

BEST MODE OF CARRYING OUT THE INVENTION

Figure 1:
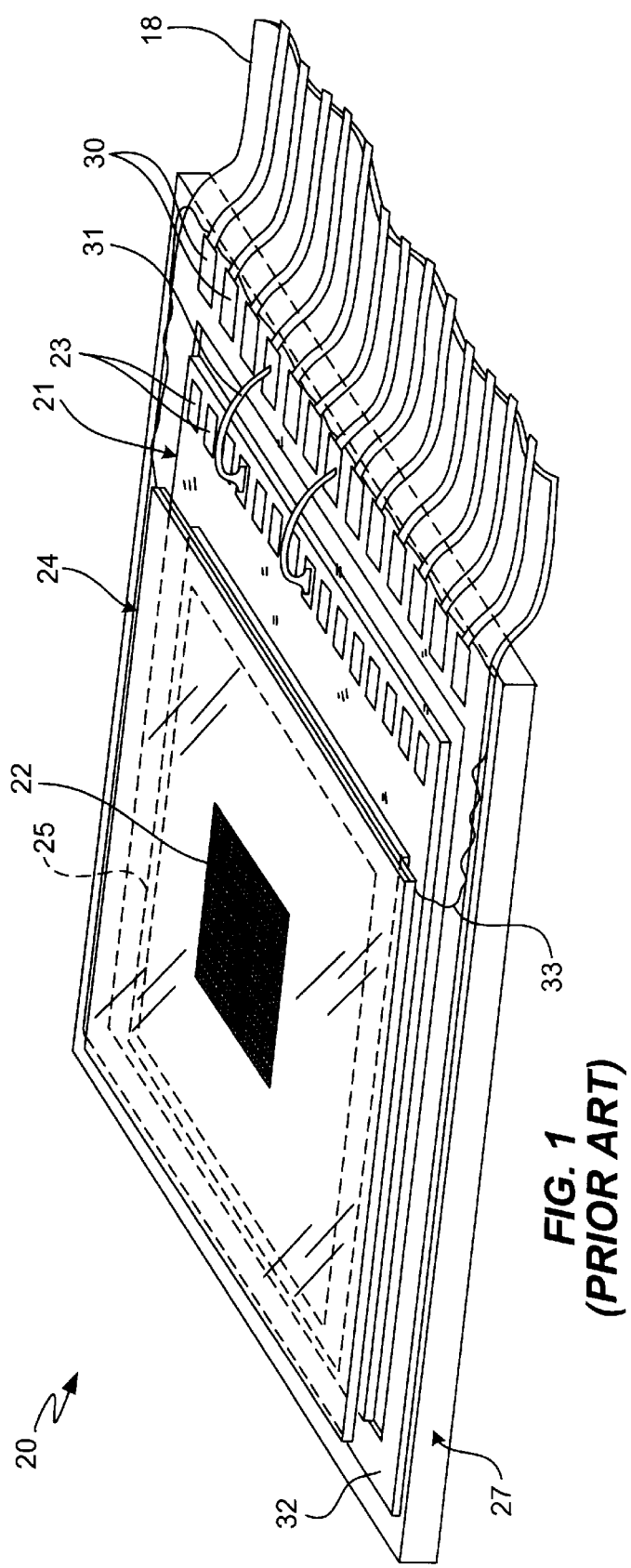
FIG. 1 is a top perspective view of a prior art Liquid Crystal Display (LCD) assembly illustrating a die rigidly mounted to a substrate.

While the present invention will be described with reference to a few specific embodiments, the description is illustrative of the invention and is not to be construed as limiting the invention. Various modifications to the present invention can be made to the preferred embodiments by those skilled in the art without departing from the true spirit and scope of the invention as defined by the appended claims. It will be noted here that for a better understanding, like components are designated by like reference numerals throughout the various figures.

Figure 4:
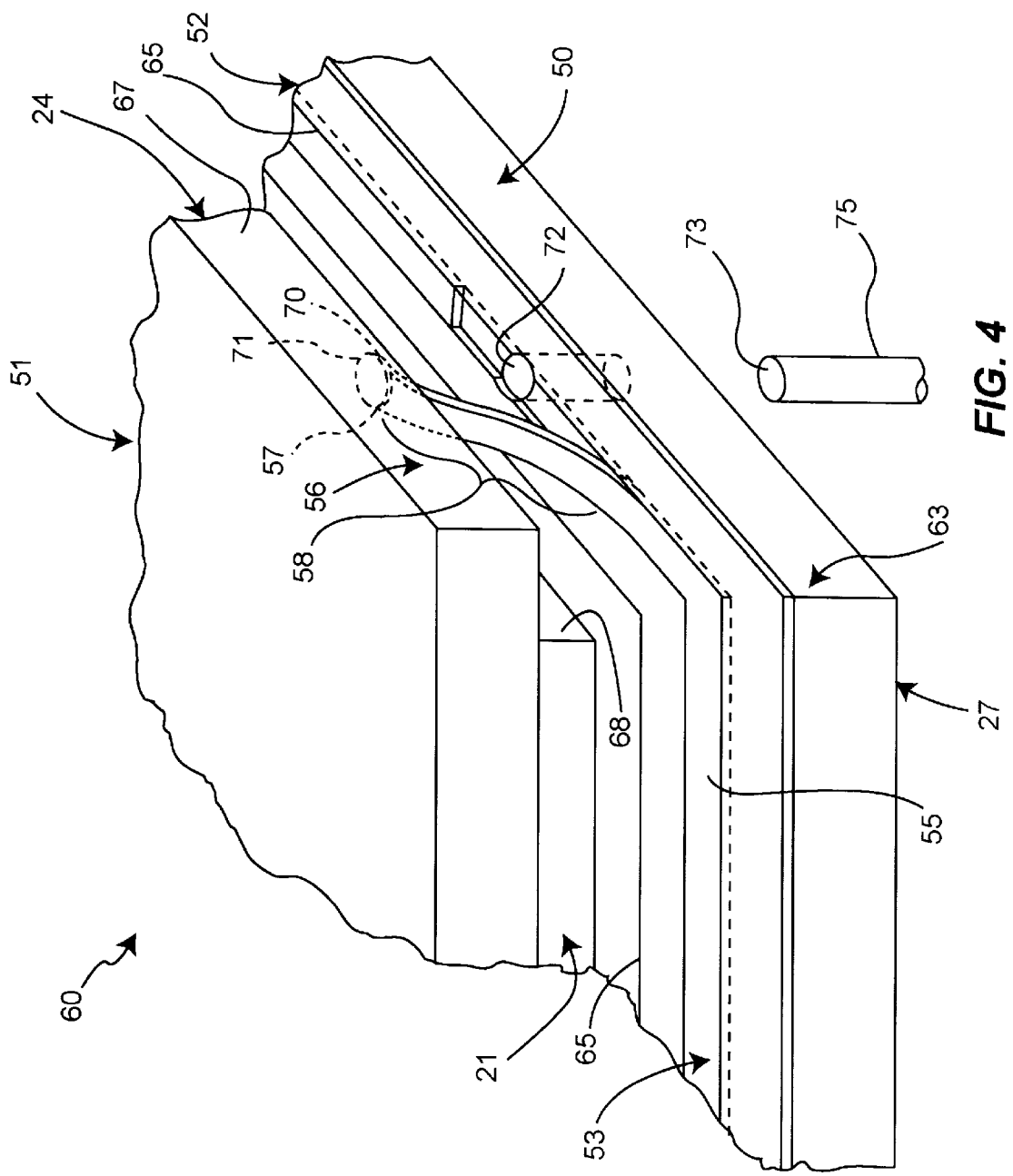
FIG. 4 is a top perspective view of a frontside of a Liquid Crystal Display (LCD) designed in accordance with the present invention.
Figure 5A:
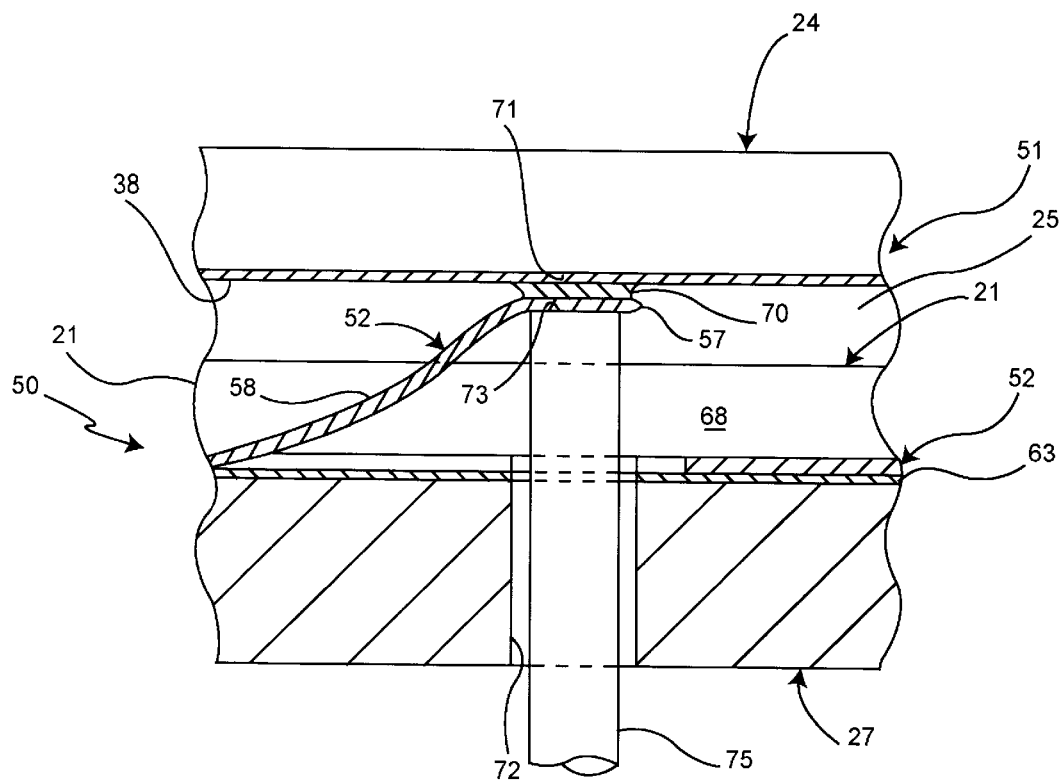
FIGS. 5A and 5B is a sequence of enlarged, fragmentary, side elevation views of the LCD assembly of FIG. 4 illustrating mounting of the second circuit to the transparent plate.

Attention is now directed to FIGS. 4 and 5A where a connection assembly, generally designated 50, of the present invention is provided to electrically couple a transparent plate 24 of a liquid crystal display device 51 to an operating subsystem (not shown). The connection assembly 50 includes an elongated flexible tape member 52 having an elongated metallic second circuit 53. This metallic second circuit 53 includes a main circuit portion 55 fixedly mounted to the tape member 52, and a second terminal portion 56 which includes a contact portion 57 adapted to electrically couple to the transparent plate 24, and a substantially flexible and movable conductive joint portion 58. Collectively, the conductive joint portion 58 electrically couples the contact portion 57 to the main circuit portion 55 of the metallic second circuit 53 in a manner substantially minimizing residual stresses formed from the electrical coupling between the transparent plate and the circuit portion.

Accordingly, a low resistance and relatively stress-free electrical connection is constructed between the transparent plate and the metallic circuit since the conductive joint portion of the connection assembly is substantially flexible for sufficient horizontal, vertical and rotational displacements. Thus, the transparent plate is substantially insulated from the residual stress induced warpage caused between the substrate and the transparent plate by the electrical connection therebetween, the cumulative effect of which minimizes the residual stress on the liquid crystal cells. The distance between the die and the transparent plate, consequently, may be more uniformly maintained throughout the entire opposed surfaces during operation and/or formation of the transparent plate electrical connection. The residual stress induced optical defects, including variations in color uniformity and fringes, and optical shadows may therefore be substantially minimized.

Figure 6:
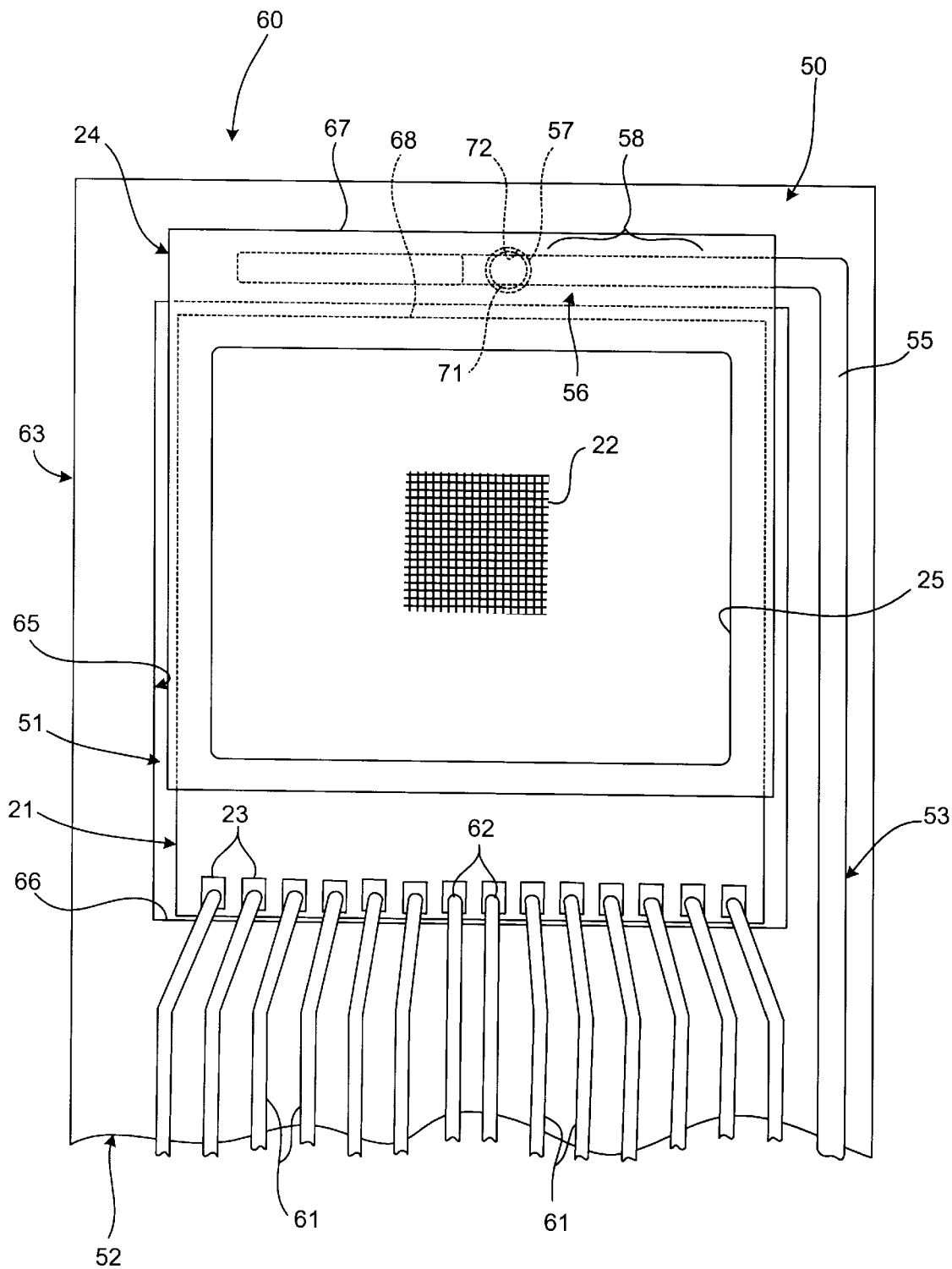
FIG. 6 is an enlarged, fragmentary top perspective view of a rearside of the Liquid Crystal Display (LCD) of FIG. 4 illustrating a connection assembly of the present invention providing a substantially stress-free electrical connection between the transparent plate and the flex circuit.

As best viewed in FIGS. 4 and 6, the connection assembly 50 and the display device 51 together form a Liquid Crystal Display (LCD) assembly 60. The display device 51 includes a die 21 having a pixel array 22, and a transparent plate 24 positioned over and adjacent the die 21. An adhesive seal 25 adhesively couples the die 21 to the transparent plate 24. The adhesive seal 25 together with the transparent plate 24 and the die 21 cooperate to define a sealed volume therebetween encompassing the pixel array 22. A liquid crystal material is disposed within the sealed volume. Preferably, these liquid crystals are Polymer Dispersed Liquid Crystals which are dispersed in a polymer solution. Other types of liquid crystals, however, may be utilized in accordance with the present invention. The flexible tape member 52 is a flex circuit device including a plurality of primary circuits 61 and incorporating the second circuit 53 of the connection assembly 50. The primary circuits 61 terminate at respective first terminals 62 of a coupling region 63 thereof which are to be electrically coupled to the bonding pads 23 of the die 21.

The transparent plate 24 may be composed of any suitable material such as glass or plastic, or the like, which provides substantial rigidity to the display device. While the transparent plate 24 is preferably rectangular, it will be understood that the peripheral shape thereof may any geometric shape sufficient to cover the pixel array of the die, while further sufficiently mounting to the display device 51 to the substrate 27. A conductive coating 38 is preferably applied to the undersurface 28 of the plate, such as indium-tin oxide, to enhance electrical conductivity. This coating is a transparent conductive medium which enables a constant charge to be applied to the transparent plate or glass. The indium-tin oxide coating is preferably about $2.0$–$6.0 \times 10^{-6}$ in. thick and is capable of electrically supporting indium based solders or epoxies, or the like.

Briefly, the small scale LCD assembly 60 includes a pixel array 22 formed on die 21. Die bonding pads 23 are preferably disposed on one side of the silicon die 21 which are electrically coupled to pixel array 22 through internal circuitry (not shown) to facilitate control of the pixel array 22. These die bonding pads 23 also provide electrical connection from the ground and power of the die 21 to the ground and power of a substrate.

In the preferred form of the present invention, the LCD assembly 60 further includes a substantially planar support substrate 27 upon which a distal coupling region 63 of the tape member 52 may be supportively mounted or adhered to for mounting support. The tape member 52 at the coupling region 63 may include any conventional adhesive backing to facilitate adherence to the top surface of the substrate. Moreover, the support substrate further preferably functions to vertically support the die 21 thereatop. In one embodiment, the die 21 may be rigidly attached to the substrate 27, while in another embodiment, the substrate 27 is configured to cooperate with the display device 51 such that the die 21 is substantially insulated from transmission of residual stresses induced by or acting upon the substrate 27. In this configuration, since the substrate is not rigidly or semi-rigidly attached directly to the die 21, residual stresses induced by or acting upon the substrate will not be transmitted directly to the die. Stress induced optical distortions, and transparent plate delamination, are therefore significantly reduced. An example of this arrangement is disclosed in U.S. patent application Ser. No. 09/130,631, filed Aug. 6, 1998, and incorporated by reference in its entirety.

Any suitable type of substrate may be utilized in accordance with the present invention. Support substrate 27, for example, may be provided by simple substrates and chip carriers, leaded chip carriers, grid array type substrates, as well as other types of substrates which can be used for supporting the display device 51. In the preferred form, support substrate 27 will be composed of a material with a similar thermal expansion to that of silicon, taking into account its weight, availability, machinability, cost and expansion properties, as will be discussed henceforth. These materials may include aluminum, ceramic, plastic and alloy 42.

Figure 7:
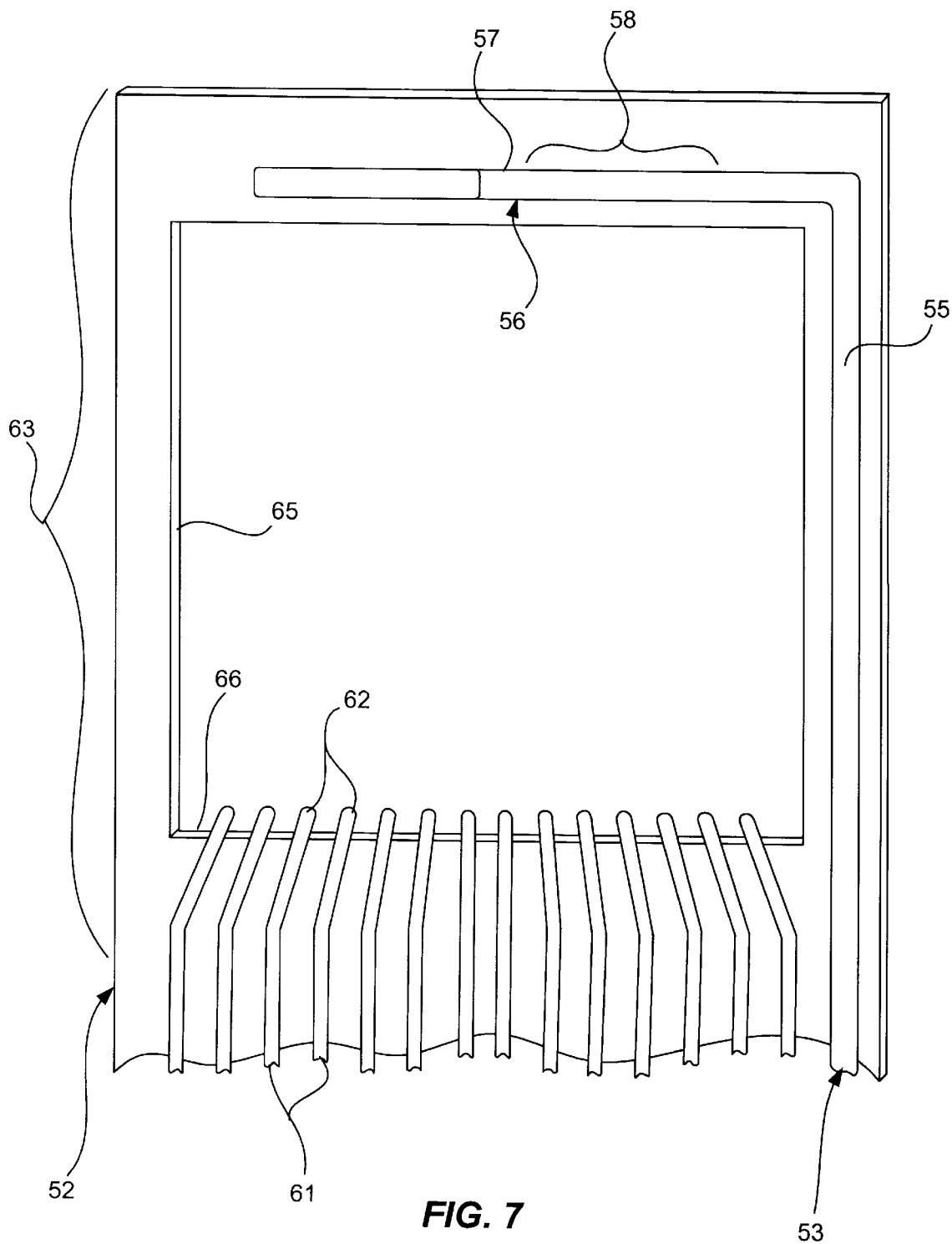
FIG. 7 is an enlarged, fragmentary top perspective view of the flex circuit illustrating a receptacle portion of a coupling region thereof.

Referring now to FIG. 7, the flexible tape member 52 is preferably provided by a flex circuit device composed of a relatively thin polyimide material or the like which provides substantial flexibility for the circuits. These ribbon-type circuits further provide sufficient electrical insulation between the adjacent circuits (i.e., the primary circuits 61 and second circuit 53) to prevent shorting therebetween. The primary circuits 61 terminate at the first terminals 62 of coupling region 63.

In one embodiment, the terminals of the primary circuits are provided by substrate bond pads (similar to the substrate bonding pads 23 of the prior art of FIGS. 1–3, but not shown in FIGS. 4 and 6) positioned on a corresponding surrounding edge opposite the die bonding pads 23 when the display device 51 is mounted to the substrate 27. The substrate bond pads, thus, can be easily mounted to the substrate 27 by securely affixing the backside of the polyimide tape to the top surface of the substrate as above-mentioned. Conventional wire bonds may then be employed to electrically connect the die bond pad to the corresponding substrate bond pad. A glob coating (not shown) may then be applied to and between the die bonding pads 23 and the substrate bond pads to provide protection for bonding wires and the internal elements of die 21, such as the die bonding pads 23, ground pads, and ground bond pads.

In another embodiment, however, these first terminals 62 of the primary circuits 61 are provided by beams terminals which are components of a Tape Automated Bonding (TAB) interconnection employed to electrically interconnect the primary circuits 61 to the bonding pads 23 of die 21. The application of TAB bonding for this arrangement is advantageous over conventional wire bonds for several reasons. For instance, the structural integrity of the bonds are significantly increased over the conventional bonding wires techniques currently applied. This increased structural integrity also increases bond durability, as well as simplifying alignment between the beams and the corresponding bond pads. An example of this arrangement is disclosed in U.S. patent application Ser. No. 09/209,868, filed Dec. 11, 1998, and incorporated by reference in its entirety.

The coupling region 63 of the flex circuit device or tape member 52 preferably provides a receptacle 65 extending therethrough which is formed and dimensioned for receipt of the LCD panel assembly 60 therein (FIGS. 6 and 7). The coupling region, thus, essentially forms a flexible ring which is preferably adhesively mounted atop the substrate 27 to surround the display device 51 when the display is coupled to the substrate 27. At a proximal edge 66 of receptacle 65 of the coupling region 63 of the primary circuits 61 terminate the beam terminals 62 for TAB bonding to the corresponding die bonding pads 23.

In accordance with the present invention, the metal or conductive second circuit 53 which is embedded or contained in the polyimide tape member 52, extends peripherally around the receptacle edges to a location at the distal portion of the coupling region 63. This metal second circuit 53 enables a constant charge to be applied across the transparent plate 24 which is electrically and thermally connected the indium-tin oxide conductive coating 38 in the present inventive relatively stress-free manner. The present invention, however, may be applied between any electrical components requiring a relatively stress-free electrical connection, such as a ground or the like.

FIGS. 4 and 6 illustrate that the distal peripheral edge 67 of transparent plate 24 extends beyond the distal peripheral edge 68 of the die 21. Accordingly, the plate distal peripheral edge 67 preferably extends vertically over and adjacent the distal portion of the substrate 27 and the second terminal portion 56 of the second circuit 53 for electrical coupling thereto.

Preferably, the second terminal portion 56 is integrally formed with the main circuit portion 55 of the second circuit 53. This integral configuration enables substantial flexibility and continuity longitudinally therealong from the main circuit portion 55 to the contact portion 57. As mentioned above, the flexibility of the conductive joint, particularly in the vertical direction (i.e., Z-axis), minimizes the formation and transmission of residual stresses between the substrate 27 and the transparent plate 24.

In the preferred embodiment, the second terminal portion 56 is formed from an integral section of the main circuit portion 55 which is physically separated from its laminated mount in the coupling region 63 of the polyimide tape. As best viewed in FIGS. 4 and 5, the second terminal portion 56 may be lifted out of and separated from embedded constraint in the polyimide tape so that it is relatively free floating compared to the surrounding polyimide tape which is adhered to the substrate 27. Accordingly, the substantially rigid electrical connections between the substrate 27 and the transparent plate 24 which are employed in the current LCD display designs are eliminated. In turn, the substantial flexibility of the conductive joint portion 58 substantially reduces, if not eliminates, residual stresses typically caused by epoxy shrinkage during curing or thermal expansion during operation.

The length of the separated strip of metallic circuit (i.e., the second terminal portion 56) is at least about 1.5 times, and more preferably greater than 4 times, the height of the vertical gap between the top surface of the substrate 27 and the coating 38 applied to the undersurface of the transparent plate 24, depending upon the rigidity of the strip. Essentially, this length is sufficient to enable electrical conductive contact with the coating 38 while allowing a sufficient degree of slack or free floating ability to provide the above-indicated substantially stress-free flexibility.

To separate the appropriate section of the main circuit portion 55 from the polyimide tape member 52, a cutting device (not shown) may be employed to cut or splice through circuit portion. Subsequently, the incised section (i.e., the lead terminal) of the metallic second circuit 53 may be separated by pulling the second terminal portion 56 away from the polyimide tape member 52 while the main circuit portion 55 remains laminated to the coupling region. The second terminal portion 56 will then be free to move relative to the remaining laminated primary circuit portion adhered to the substrate.

To enable electrical connection with the contact portion 57 of the second terminal portion 56, the thin top layer of insulative polyimide must be removed to expose the lead terminal. However, since the metallic second circuit 53 is preferably provided by a copper material, oxidation can occur. A thin metallic layer of gold, indium solder or the like is preferably applied to the exposed metallic surface to form a protective barrier to oxidation of circuit.

In the preferred form, an additional conductive material 70 may be applied to the top surface of contact portion 57 of the second terminal portion 56 to further facilitate electrical contact with a bond site 71 at the conductive coating 38. Applying heat and pressure at the bond site 71, as will be discussed in greater detail below, the conductive material 70 will liquefy and electrically connect and physically couple the terminal contact portion 57 to the conductive coating 38.

The conductive material 70 is preferably provided by an indium based solder, a solder paste, a solder pre-form, a conductive epoxy, or a relatively low melting point metal, such as pure indium or tin. This may first be applied to the contact portion 57 of the second terminal portion 56 before or after separation of the lead terminal from the polyimide tape. While the conductive material is preferably applied to the lead terminal contact portion 57 before being coupled to the bond site 71 of the coating 38, it will be appreciated that the conductive material may first be applied to the coupling region 63 of the coating 38.

Moreover, the conductive material 70 may be provided by a Kovar slug or the like mounted between the coating coupling region 63 and the contact portion 57 of the second terminal portion 56. Applying conductive epoxy or the like, this arrangement provides a similar mount to the conventional rigid electrical connections. However, since the conductive joint portion 58 of the second terminal portion 56 lead still remains freely floating relative the support substrate 27, any shrinkage during curing of the conductive epoxy, or any thermal expansion due to operation, will be accommodated so that no residual stresses are imparted on transparent plate 24.

Figure 5B:
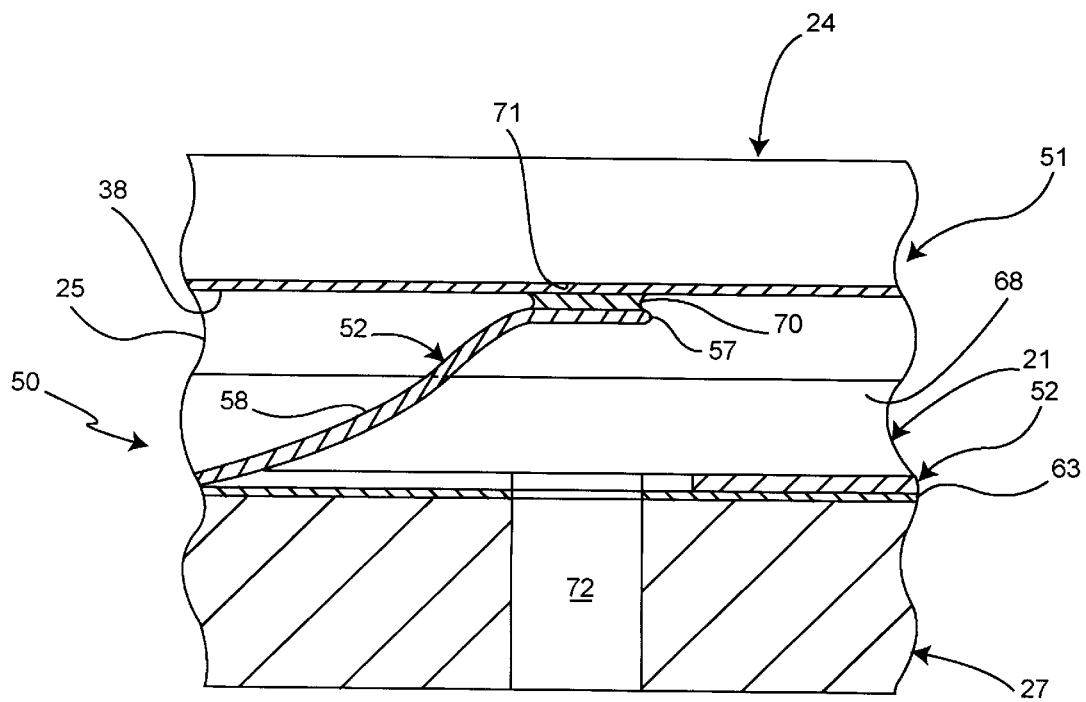

In accordance with the present invention and as shown in FIGS. 5A, 5B and 6, an access aperture 72 is provided extending through the substrate 27 from the bottom surface to the top surface thereof. Due to the minute spacing (i.e., about 2–4 $\mu$m) between the transparent plate 24 and the die 21, it is extremely difficult to form a durable electrical connection between the second terminal portion 56 and the indium coating 38. This aperture 72, thus, provides additional access space to the terminal bond site to fabricate the electrical and physical connection.

As best illustrated in FIGS. 5A and 5B, the access aperture 72 is formed and dimensioned to enable a distal tip portion 73 of an elongated heated thermode or thermal probe 75 to be positioned therethrough. Upon contact of the distal tip portion 73 with an undersurface of the contact portion 57 of second terminal portion 56, the tipper surface thereof (or the conductive material 70) may be urged against the indium coating 38 for electrical and physical coupling therebetween. The application of heat from the thermal probe 75 to the lead terminal will cause localized heating to melt the conductive material 70 which in turn will electrically mount the terminal contact portion 57 to the bond site 71 of the coating 38. Depending upon the composition of the conductive material 70, the heat and pressure applications, as well as the duration thereof, of the heated thermode may vary. For example, a heated thermode of about 150° C. to about 175° C. with a pressure of about 450 gmf to about 500 gmf may be used to bond an anisotropic conductive adhesive.

In another aspect, a method of packaging a liquid crystal display assembly 60 is provided comprising: providing a display device 51 and providing an elongated flexible tape member 52. The display device, as apparent from the description of the present invention, includes a die 21 having a pixel array 22, a transparent plate 24, an adhesive seal 25 adhesively coupling the die to the transparent plate 24, and a liquid crystal material 70 disposed within a sealed volume formed between the adhesive seal, the transparent plate 24 and the die 21. The elongated flexible tape member 52 includes a main circuit portion 55 fixedly mounted thereto, and includes a second terminal portion 56 thereof The present inventive method further includes electrically connecting a contact portion 57 of the second terminal portion 56 to the transparent plate 24 through a substantially flexible and movable conductive joint portion 58 of the second terminal portion 56 to substantially minimize residual stresses formed from the electrical coupling between the transparent plate 24 and the second circuit 53.

In accordance with the present invention, the electrical connecting includes forming the conductive joint portion 58 by physically separating a section of the main circuit portion 55 from fixed mounting to the tape member 52 to enable the substantial flexibility thereof for a substantially stress-free electrical connection. The electrical connecting may further include thermally bonding, or adhering through an electrically conductive pressure sensitive adhesive, the contact portion 57 to transparent plate 24. In this alternative, the thermal bonding is performed by applying a heated thermode or probe 5 to a backside of the second terminal portion 56 for heat bonding thereof.

In another aspect of the present invention, a method of packaging a liquid crystal display assembly 60 is provided including separating a section of the main circuit portion 55 from fixed mounting to the tape member 52 to form a second terminal portion 56 having a contact portion 57 and a substantially flexible and movable conductive joint portion 58 therebetween; and electrically connecting the contact portion 57 to the transparent plate 24 such that the substantially flexible and movable conductive joint portion 58 substantially minimizes residual stresses formed from the electrical coupling between the transparent plate 24 and the main circuit portion 55.

The method further includes mounting the die 21 of the liquid crystal display device 51 to a substrate 27, and affixing a distal coupling region 63 of the tape member 52 to the substrate 27. The electrically connecting further includes thermally bonding the contact portion to transparent plate which may be performed by applying a heated thermode 73 to a backside of the second terminal portion 56 to heat bonding thereof This applying may include positioning the heated thermode through an aperture 72 extending through the substrate 27.

What is claimed is:
1. A connection assembly for electrically coupling a transparent plate of a liquid crystal display device to an operating subsystem comprising:
   an elongated flexible tape member; and
   an elongated metallic circuit including a main circuit portion fixedly mounted to the tape member and a lead terminal having a contact portion adapted to electrically couple to said transparent plate at a point contact, and a substantially flexible and freely movable conductive joint portion electrically coupling the contact portion to the circuit portion of the metallic circuit and adapted to enable relative horizontal, vertical and rotational displacement between the transparent plate and the main circuit portion to substantially minimize residual stresses urged upon the transparent glass by said conductive joint portion and formed from the electrical coupling therebetween.

2. The connection assembly as defined in claim 1 wherein, said conductive joint is provided by a section of said main circuit portion physically separated from fixed mounting to the tape member in a manner enabling said substantial flexibility thereof for a substantially stress-free electrical connection.

3. The connection assembly as defined in claim 2 wherein, said contact portion includes a conductive material mounted to a surface portion of the conductive joint.

4. The connection assembly as defined in claim 3 wherein, said conductive material is selected from the group consisting essentially of a conductive epoxy, a solder pre-form, a solder paste, metal and conductive adhesive.

5. The connection assembly as defined in claim 1 wherein, said tape member is provided by a polyamide tape, and said metallic circuit is provided by a copper metallic strip laminated to the polyamide tape.

6. The connection assembly as defined in claim 5 wherein, the exposed surface of said conductive joint is coated with a conductive material.

7. The connection assembly as defined in claim 1 further including:

a plurality of circuits mounted to said tape member and terminating at respective terminals of a coupling region of said tape member, said terminals being electrically coupled to respective bond pads of the liquid crystal display device.

8. The connection assembly as defined in claim 7 wherein, said coupling region of said tape member defining a receptacle portion formed and dimensioned for receipt of the liquid crystal display device therein.

9. The connection assembly as defined in claim 8 wherein, said coupling region of said tape member being fixedly mounted to a substrate of the liquid crystal display device.

10. The connection assembly as defined in claim 9 wherein, said conductive joint is provided by a section of said main circuit portion physically separated from fixed mounting to the tape member in a manner enabling said substantial flexibility thereof for a substantially stress-free electrical connection.

11. The connection assembly as defined in claim 10 wherein, tape member is provided by a polyamide tape, and said metallic circuit is provided by a copper metallic strip laminated to the polyamide tape.

12. A liquid crystal display assembly comprising:
a display device including:
a die having a pixel array and a plurality of bond pads in electrical communication with the pixel array;
a transparent plate;
an adhesive seal adhesively coupling the die to the transparent plate, said adhesive seal, said transparent plate and said die cooperating to define a sealed volume therebetween encompassing the pixel array; and
a liquid crystal material disposed within the sealed volume; and
a flex circuit device having a flexible tape member, a plurality of primary circuits terminating at respective first terminals of a coupling region thereof, said first terminals being electrically coupled to said bond pads of said die for connection thereof, and a second circuit having a main circuit portion fixedly mounted to said tape member and terminating at a second terminal, said second terminal having a contact portion adapted to electrically couple to said transparent plate at a point contact, and a substantially flexible and freely movable conductive joint portion electrically coupling the contact portion to the circuit portion of the second circuit and adapted to enable relative horizontal, vertical and rotational displacement between the transparent plate and the main circuit portion to substantially minimize residual stresses urged upon the transparent glass by said conductive joint portion and formed from the electrical coupling therebetween.

13. The liquid crystal display assembly as defined in claim 12 wherein,
said conductive joint is provided by a section of said main circuit portion physically separated from fixed mounting to the tape member in a manner enabling said substantial flexibility thereof for a substantially stress-free electrical connection.

14. The liquid crystal display assembly as defined in claim 13 wherein,
said contact portion includes a conductive material mounted to a surface portion of the conductive joint.

15. The liquid crystal display assembly as defined in claim 14 wherein,
said conductive material is selected from the group consisting essentially of a conductive epoxy, a solder pre-form, a solder paste, metal and conductive adhesive.

16. The liquid crystal display assembly as defined in claim 14 further including:
a substantially thin conductive coating on at least a portion of the surface of said transparent plate in conductive contact with the contact portion of the second terminal.

17. The liquid crystal display assembly as defined in claim 16 wherein,
said conductive coating includes an indium coating.

18. The liquid crystal display assembly as defined in claim 17 wherein,
said conductive material includes an indium solder.

19. The liquid crystal display assembly as defined in claim 12 wherein,
said tape member is provided by a polyamide tape, and said primary circuits and said second circuit are provided by a copper metallic strip laminated to the polyamide tape.

20. The liquid crystal display assembly as defined in claim 19 wherein,
the exposed surface of said conductive joint is coated with a conductive material.

21. The liquid crystal display assembly as defined in claim 12 wherein, said coupling region of said tape member defines a receptacle portion formed and dimensioned for receipt of the liquid crystal display device therein.

22. The liquid crystal display assembly as defined in claim 21 further including:

a substrate coupled to a backside surface of said die, and said coupling region of said tape member being fixedly mounted to said substrate.

23. The liquid crystal display assembly as defined in claim 22 wherein, said conductive joint is provided by a section of said main circuit portion physically separated from fixed mounting to the tape member in a manner enabling said substantial flexibility thereof for a substantially stress-free electrical connection.

24. The liquid crystal display assembly as defined in claim 22 wherein, said substrate includes an aperture formed and dimensioned for receipt of a probe therethrough to enable contact with a backside of said conductive joint to electrically bond said contact portion to the transparent plate at a bond site.

25. The liquid crystal display assembly as defined in claim 24 wherein, said aperture is positioned in substantial vertical alignment with the bond site.

26. The liquid crystal display assembly as defined in claim 24 wherein, said probe is a heated thermode, and said contact portion includes a thermal bond conductive material forming a thermal bond between the transparent plate and said second terminal lead when contacted by said heated thermode.

27. The liquid crystal display assembly as defined in claim 22 wherein, a proximal end of said die includes a proximal lip portion containing said bond pads and formed to extend beyond a proximal end of said transparent plate, and a distal end of said transparent plate includes a distal ledge portion formed to extend beyond a distal end of said die for electrical interconnection with the lead terminal contact portion.

28. A method of packaging a liquid crystal display assembly comprising:

providing a display device including a die having a pixel array, a transparent plate, an adhesive seal adhesively coupling the die to the transparent plate, and a liquid crystal material disposed within a sealed volume formed between the adhesive seal, the transparent plate and the die;

providing an elongated flexible tape member including a main circuit portion fixedly mounted thereto, and having a lead terminal thereof;

electrically connecting a contact portion of the lead terminal to the transparent plate at a point contact through a substantially flexible and freely movable conductive joint portion of the lead terminal to enable relative horizontal, vertical and rotational displacement between the transparent plate and the main circuit portion to substantially minimize residual stresses urged upon the transparent glass by said conductive joint portion and formed from the electrical coupling therebetween.

29. The method as defined in claim 28 wherein, said electrically connecting includes forming said conductive joint by physically separating a section of the main circuit portion from fixed mounting to the tape member to enable said substantial flexibility thereof for a substantially stress-free electrical connection.

30. The method as defined in claim 28 wherein, said electrically connecting further includes thermally bonding the contact portion to transparent plate.

31. The method as defined in claim 30 wherein, said thermally bonding is performed by applying a heated thermode to a backside of the lead terminal for heat bonding thereof.

32. The method as defined in claim 31 wherein, said contact portion includes a thermal bond conductive material forming a thermal bond between the transparent plate and said lead terminal when contacted by said heated thermode.

33. The method as defined in claim 32 wherein, said die is mounted to a substrate, and said applying includes positioning the heated thermode through an aperture extending through said substrate.

34. A method of packaging a liquid crystal display assembly comprising:

providing a display device including a die having a pixel array, a transparent plate, an adhesive seal adhesively coupling the die to the transparent plate, and a liquid crystal material disposed within a sealed volume formed between the adhesive seal, the transparent plate and the die;

providing an elongated flexible tape member including a main circuit portion fixedly mounted thereto;

separating a section of the main circuit portion from fixed mounting to the tape member to form a lead terminal having a contact portion and a substantially flexible and movable conductive joint portion therebetween; and electrically connecting the contact portion of the lead terminal to the transparent plate at a point contact such that the substantially flexible and freely movable conductive joint portion enables relative horizontal, vertical and rotational displacement between the transparent plate and the main circuit portion to substantially minimize residual stresses urged upon the transparent glass by said conductive joint portion and formed from the electrical coupling therebetween.

35. The method as defined in claim 34 further including:

mounting the die of the liquid crystal display device to a substrate, and affixing a distal coupling region of the tape member to said substrate.

36. The method as defined in claim 35 wherein, said electrically connecting further includes thermally bonding the contact portion to transparent plate.

37. The method as defined in claim 36 wherein, said thermally bonding is performed by applying a heated thermode to a backside of the lead terminal to heat bonding thereof.

38. The method as defined in claim 37 wherein, said applying includes positioning the heated thermode through an aperture extending through said substrate.

* * * * *